United States Patent
Liang

(10) Patent No.: US 10,326,458 B2
(45) Date of Patent: Jun. 18, 2019

(54) SWITCHED-CAPACITOR LOOP FILTER

(71) Applicant: MEDIATEK INC., Hsin-Chu (TW)

(72) Inventor: Che-Fu Liang, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 40 days.

(21) Appl. No.: 15/328,901

(22) PCT Filed: Jul. 31, 2015

(86) PCT No.: PCT/CN2015/085669
§ 371 (c)(1),
(2) Date: Jan. 24, 2017

(87) PCT Pub. No.: WO2016/015673
PCT Pub. Date: Feb. 4, 2016

(65) Prior Publication Data
US 2017/0214408 A1    Jul. 27, 2017

Related U.S. Application Data

(60) Provisional application No. 62/031,970, filed on Aug. 1, 2014.

(51) Int. Cl.
| H03L 7/093 | (2006.01) |
| H03L 7/107 | (2006.01) |
| H03L 7/099 | (2006.01) |
| H03L 7/197 | (2006.01) |
| H03H 19/00 | (2006.01) |

(Continued)

(52) U.S. Cl.
CPC ......... *H03L 7/1075* (2013.01); *H03H 19/004* (2013.01); *H03L 7/0891* (2013.01); *H03L 7/093* (2013.01); *H03L 7/099* (2013.01); *H03L 7/104* (2013.01); *H03L 7/107* (2013.01);
(Continued)

(58) Field of Classification Search
CPC ......... H03L 7/093; H03L 7/091; H03L 7/104; H03L 7/107; H03L 7/1075
See application file for complete search history.

(56) References Cited

U.S. PATENT DOCUMENTS

| 6,667,663 B2* | 12/2003 | Ozawa ...................... H03L 7/07 327/16 |
| 7,095,287 B2* | 8/2006 | Maxim ................. H03L 7/0893 331/11 |

(Continued)

FOREIGN PATENT DOCUMENTS

| CN | 1589521 A | 3/2005 |
| CN | 1613185 A | 5/2005 |

(Continued)

OTHER PUBLICATIONS

"International Search Report" dated Sep. 25, 2015 for International application No. PCT/CN2015/085669, International filing date:Jul. 31, 2015.

*Primary Examiner* — Thomas J. Hiltunen
(74) *Attorney, Agent, or Firm* — Winston Hsu

(57) ABSTRACT

A loop filter has a first switched-capacitor network and a second switched-capacitor network. The first switched-capacitor network is coupled to an input node of the loop filter. The second switched-capacitor network is coupled to the input node of the loop filter. The input node of the loop filter is arranged to receive an input from a charge pump.

17 Claims, 11 Drawing Sheets

(51) Int. Cl.
*H03L 7/089* (2006.01)
*H03L 7/10* (2006.01)
*H03M 1/10* (2006.01)

(52) U.S. Cl.
CPC ........ *H03L 7/1976* (2013.01); *H03M 1/1009* (2013.01); *H03L 2207/06* (2013.01)

(56) References Cited

U.S. PATENT DOCUMENTS

| | | | |
|---|---|---|---|
| 7,161,523 B1* | 1/2007 | Zortea | H03M 1/1004 341/120 |
| 7,679,468 B1* | 3/2010 | Groe | H03C 3/0925 331/23 |
| 9,906,230 B2* | 2/2018 | Petrov | H03L 7/099 |
| 2001/0009403 A1 | 7/2001 | Huang | |
| 2002/0089438 A1 | 7/2002 | Fwu | |
| 2003/0086519 A1 | 5/2003 | Bushman | |
| 2005/0001689 A1* | 1/2005 | Albasini | H03L 7/0891 331/16 |
| 2005/0077955 A1 | 4/2005 | Dosho | |
| 2006/0038620 A1 | 2/2006 | Drapkin | |
| 2006/0214737 A1* | 9/2006 | Brown | H03L 7/0893 331/16 |
| 2006/0226896 A1 | 10/2006 | Dosho | |
| 2007/0075787 A1 | 4/2007 | Jensen | |
| 2007/0126514 A1* | 6/2007 | Lin | H03L 7/0891 331/16 |
| 2007/0205825 A1 | 9/2007 | Dosho | |
| 2008/0166986 A1 | 7/2008 | Anand | |
| 2009/0219100 A1* | 9/2009 | Pullela | H03C 3/0925 331/44 |
| 2009/0224838 A1* | 9/2009 | Schlueter | H03L 7/0802 331/17 |
| 2011/0012652 A1* | 1/2011 | Lamanna | H03L 7/0893 327/156 |
| 2012/0074998 A1 | 3/2012 | Brett | |
| 2012/0319786 A1* | 12/2012 | Kumar | H03L 7/0896 331/1 R |
| 2013/0120072 A1* | 5/2013 | Murphy | H03L 7/0891 331/17 |
| 2015/0145571 A1* | 5/2015 | Perrott | H03L 7/093 327/159 |
| 2016/0373120 A1* | 12/2016 | Caffee | H03L 7/091 |

FOREIGN PATENT DOCUMENTS

| CN | 1943113 A | 4/2007 |
|---|---|---|
| WO | 2009109636 A2 | 9/2009 |

* cited by examiner

SWITCHED-CAPACITOR LOOP FILTER

CROSS REFERENCE TO RELATED APPLICATIONS

This application claims the benefit of U.S. provisional application No. 62/031,970, filed on Aug. 1, 2014 and incorporated herein by reference.

TECHNICAL FIELD

The present invention relates to a loop filter design, and more particularly, to a loop filter using switched-capacitor networks for noise cancellation.

BACKGROUND

High performance phase-locked loops (PLLs) are widely used in a variety of applications. For example, a PLL may be used in a wireless communication system to provide a low-noise local oscillation (LO) signal for up-conversion and down-conversion. A PLL is a negative feedback loop in which the phase of a feedback signal derived from an output signal is forced to follow that of a reference signal. The basic modern PLL may include a reference source, a phase detector (PD), a charge pump (CP), a loop filter (LF), and a voltage controlled oscillator (VCO). When a frequency divider is placed between the VCO and the PD, the PLL may be regarded as a frequency synthesizer where the frequency of the VCO output may be an integer multiple or a non-integer multiple of that of the reference signal. Unlike an integer-N PLL, a fractional-N PLL can achieve a frequency step much smaller than its reference signal and still maintain reasonably high reference frequency. However, the fractional control module used in a fractional-N PLL produces quantization phase error (which is also referred to as quantization noise for simplicity) and thus results in spurs at the VCO output, which deteriorates the spectral purity of the synthesized signal.

A typical fractional-N PLL may employ a sigma-delta ($\Sigma\Delta$) modulator as the fractional control module to dynamically control a division ratio used by the frequency divider placed between the VCO and the PD. The fractional-N frequency division is achieved through division-ratio averaging. Specifically, an integer frequency divider is used, but the division ratio is dynamically switched between two or more integer values. The instantaneous division ratio of the frequency divider can only be an integer value, but the long-term average of the division ratio is a non-integer value. As a result, the instantaneous phase error appearing at the input of the PD is not always zero due to the quantization noise. This phase error modulates the tuning of the VCO and thus creates spurious tones at the VCO output.

Though the loop bandwidth of the PLL can be reduced to reduce the quantization noise and spurs resulting from the fractional control module (e.g., $\Sigma\Delta$ modulator), it is highly desirable to increase the loop bandwidth of the PLL to reduce the VCO noise and to speed up the lock time for certain applications. Thus, there is a need for an innovative PLL with wide loop bandwidth and quantization noise cancellation.

SUMMARY

One of the objectives of the claimed invention is to provide a loop filter using switched-capacitor networks for noise cancellation. For example, the proposed switched-capacitor loop filter may be employed by a closed-loop system such as a phase-locked loop or a delay-locked loop.

According to a first aspect of the present invention, an exemplary loop filter is disclosed. The exemplary loop filter includes a first switched-capacitor network and a second switched-capacitor network. The first switched-capacitor network is coupled to an input node of the loop filter. The second switched-capacitor network is coupled to the input node of the loop filter. The input node of the loop filter is arranged to receive an input from a charge pump.

According to a second aspect of the present invention, an exemplary loop filter is disclosed. The exemplary loop filter has a switched-capacitor circuit coupled to an input node of the loop filter and an output node of the loop filter, wherein the switched-capacitor circuit is controlled by a set of control signals to adjust an output voltage of the switched-capacitor circuit.

According to a third aspect of the present invention, an exemplary signal processing circuit is disclosed. The exemplary signal processing circuit includes a loop filter, an integrator circuit, and a controllable component. The loop filter is arranged to generate a loop filter output in response to a loop filter input generated from a charge pump. The integrator circuit is arranged to generate an integrator output according to the loop filter output. The controllable component is arranged to receive the loop filter output and the integrator output, wherein an output of the controllable component is responsive to the loop filter output and the integrator output.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The main concept of the present invention is using a switched-capacitor loop filter in a closed-loop system, such as a phase-locked loop (PLL) or a delay-locked loop (DLL). The closed-loop system employing the proposed switched-capacitor loop filter can obtain one or more of the advantages, including reduced quantization noise (which may lead to better spectral purity of the output signal), minimized charge-sharing switch size and resistance (which may lead to less reference feedthrough and/or less propagation delay and peaking), increased headroom of the charge pump (which may lead to better charge pump linearity and/or better charge pump noise performance), and/or an embedded digital interface (which may offer quantization noise cancellation through predistortion). Further details of the proposed switched-capacitor loop filter are described as below.

Figure 1:
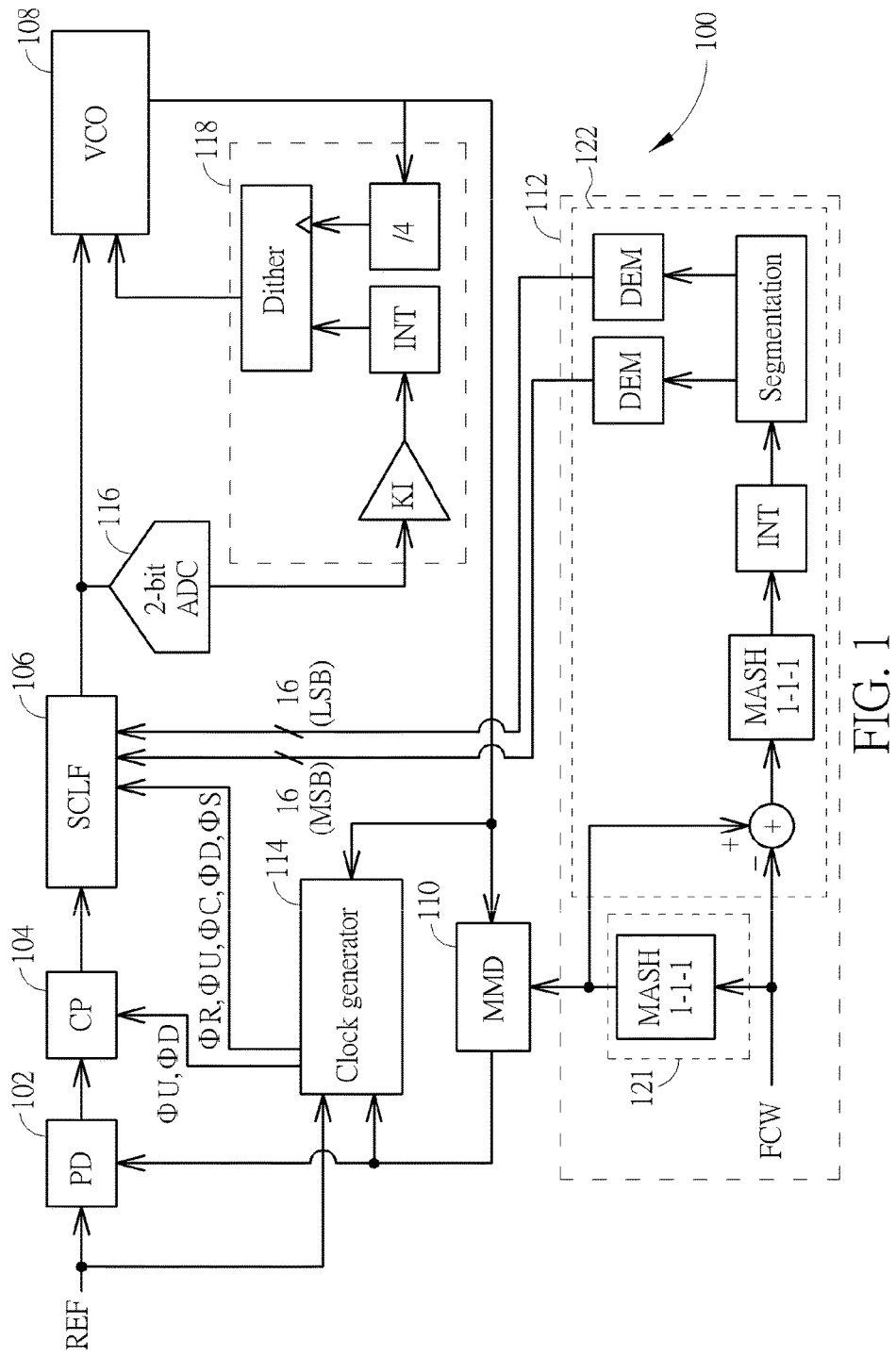
FIG. 1 is a diagram illustrating a closed-loop system according to an embodiment of the present invention.

FIG. 1 is a diagram illustrating a closed-loop system according to an embodiment of the present invention. In this embodiment, the closed-loop system 100 may be a wideband (~2 MHz) fractional-N ring-oscillator-based phase-locked loop (PLL), and may include a phase detector (PD) 102, a charge pump (CP) 104, a switched-capacitor loop filter (SCLF) 106, a controllable component (e.g., a voltage controlled oscillator (VCO) 108, a multi-modulus divider (MMD) 110, a fractional control module with phase error calculation 112, a clock generator 114, and an optional integral path (e.g., an analog-to-digital converter 116 and an integrator circuit 118). Each of the CP 104 and the SCLF 106 may be controlled by a set of clocks generated from the clock generator 114 according to the reference signal REF and the VCO output.

The fractional control module 112 may include a digital sigma-delta modulator 121 and a phase error calculation circuit 122, where the digital sigma-delta modulator 121 is arranged to refer to a frequency control word (FCW) to dynamically change the division ratio employed by the MMD 110, and the phase error calculation circuit 122 is arranged to estimate the quantization phase error between the FCW and the instantaneous division ratio set to the MMD 110, and generate a set of control signals to the SCLF 106 according to the estimated quantization phase error. Hence, the SCLF 106 is controlled by the set of control signals for quantization noise cancellation. For example, the digital sigma-delta modulator 121 may be implemented using a multi-stage noise shaping (MASH) structure such as a MASH 1-1-1 structure. However, this is not meant to be a limitation of the present invention. Similarly, the illustrated circuit structure of the phase error calculation circuit 122 is also for illustrative purposes. In practice, any circuit structure capable of converting the estimated quantization phase error introduced by the digital sigma-delta modulator 121 into a set of control signals needed by the proposed switched-capacitor loop filter 106 for noise cancellation can be adopted by the phase error calculation circuit 122. Moreover, the fractional control module 112 may be modified to include additional component(s) to achieve other function(s). For example, the fractional control module 112 may be configured to include a gain calibration circuit.

As the present invention focuses on the innovative circuit design of the loop filter adopted in the closed-loop system 100, further description of the principle of a typical fractional-N ring-oscillator-based PLL is omitted here for brevity.

Figure 2:
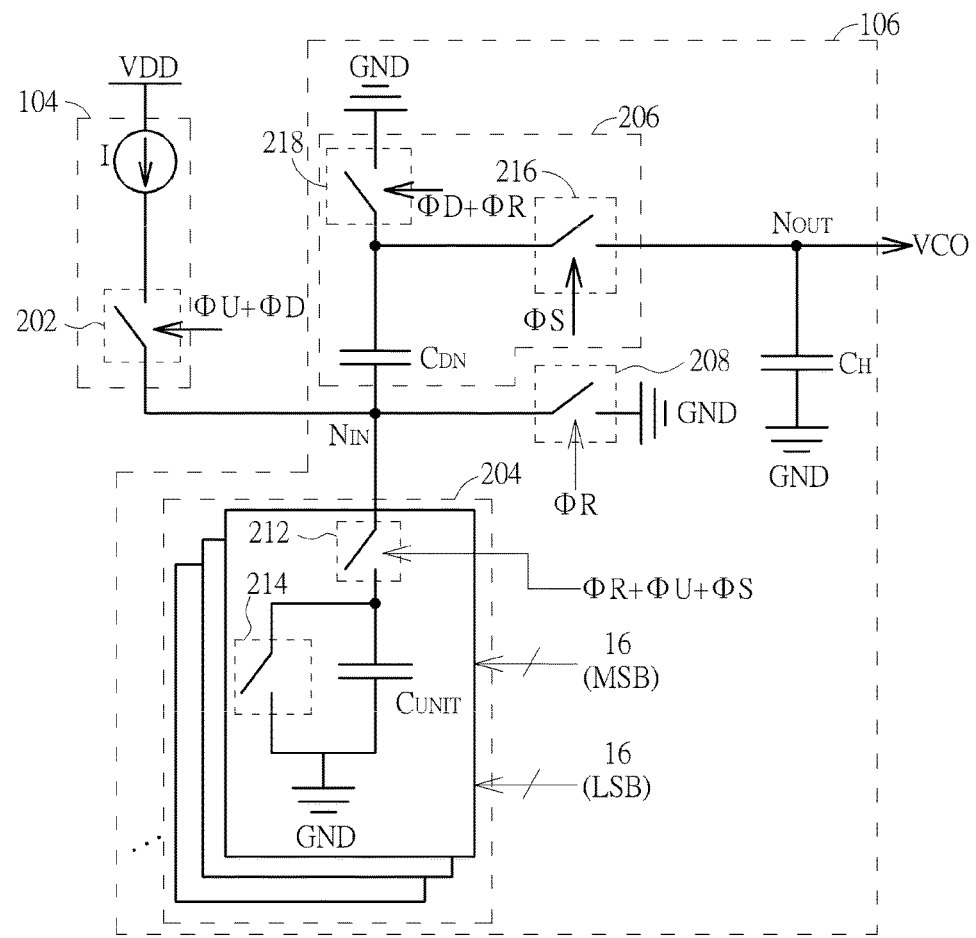
FIG. 2 is a diagram illustrating an exemplary implementation of a charge pump and a switched-capacitor loop filter shown in FIG. 1.

FIG. 2 is a diagram illustrating an exemplary implementation of the CP 104 and the SCLF 106 shown in FIG. 1. The CP 104 may be implemented using a single current source I and a switch 202. The SCLF 106 may include a switched-capacitor circuit. In this embodiment, the switched-capacitor circuit includes a first switched-capacitor network 204 and a second switched-capacitor network 206. The SCLF 106 may further include a switch 208 and a capacitor $C_H$, where the switch 208 is coupled between an input node $N_{IN}$ of the SCLF 106 and a reference voltage (e.g., ground voltage GND), and the capacitor $C_H$ is coupled between an output node $N_{OUT}$ of the SCLF 106 and the reference voltage (e.g., ground voltage GND). The first switched-capacitor network 204 may be implemented using a capacitor digital-to-analog converter (CDAC). Hence, the first switched-capacitor network (e.g., CDAC) 204 may include a plurality of unit capacitors $C_{UNIT}$, each selectively coupled to the input node $N_{IN}$ of the SCLF 106 through a switch 212 and selectively coupled to the reference voltage (e.g., ground voltage GND) through a switch 214. Regarding the second switched-capacitor network 206, it may include a capacitor $C_{DN}$ and a plurality of switches 216 and 218, where one end of the capacitor $C_{DN}$ is coupled to the input node $N_{IN}$ of the SCLF 206, and the other end of the capacitor $C_{DN}$ is selectively coupled to the reference voltage (e.g., ground voltage GND) through the switch 218 and selectively coupled to the output node $N_{OUT}$ of the SCLF 106 through the switch 216.

In this embodiment, the CDAC may have 256 unit capacitors $C_{UNIT}$, and an equivalent capacitor $C_{UP}$ of the first switched-capacitor network 204 may be $256*C_{UNIT}$ (i.e., $C_{UP}=256*C_{UNIT}$). In addition, the capacitance value of the capacitor $C_{DN}$ may be the same as the capacitance value of the equivalent capacitor $C_{UP}$ of the first switched-capacitor network 204 (i.e., $C_{UP}=256*C_{UNIT}=C_{DN}$). However, this is for illustrative purposes only, and is not meant to be a limitation of the present invention.

Figure 3:
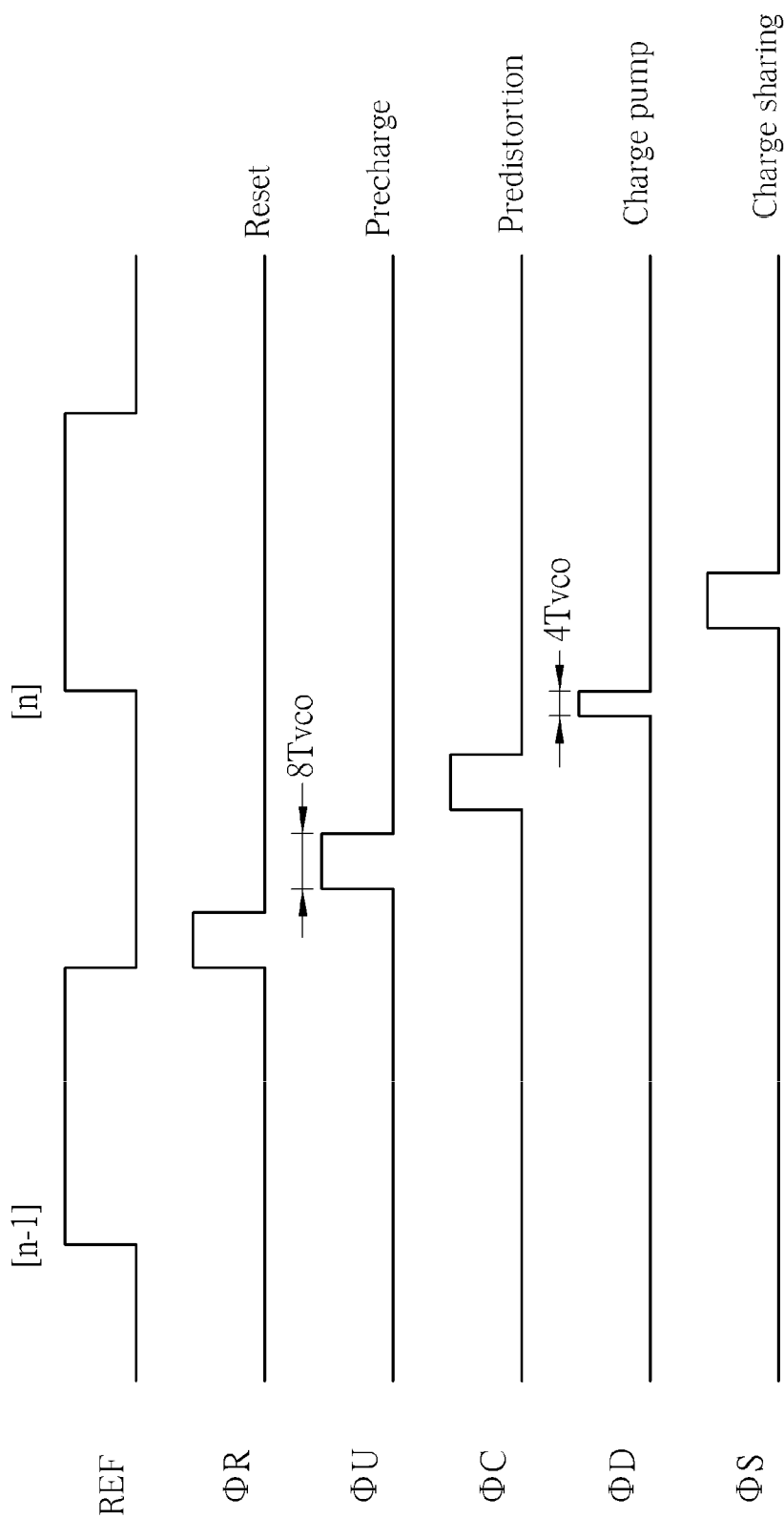
FIG. 3 is a diagram illustrating waveforms of clock signals generated from a clock generator according to an embodiment of the present invention.

The switches 214 in the first switched-capacitor network (e.g., CDAC) 204 are controlled by a set of control signals generated from the phase error calculation circuit 122 implemented in the fractional control module 112. The switches 202, 208, 212, 216 and 218 are controlled by a set of clock signals, including ΦR, ΦU, ΦC, ΦD, ΦS, generated from the clock generator 114. FIG. 3 is a diagram illustrating waveforms of the clock signals ΦR, ΦU, ΦC, ΦD, ΦS generated from the clock generator 114 according to an embodiment of the present invention. When a specific clock signal has a first logic level (e.g., "1"), a specific switch controlled by the specific clock signal is switched on; and when the specific clock signal has a second logic level (e.g., "0"), the specific switch controlled by the specific clock signal is switched off. In this embodiment, the switch 202 may be controlled by the clock signals ΦU and ΦD, the switch 212 may be controlled by the clock signals ΦR, ΦU and ΦS, the switch 208 may be controlled by the clock signal ΦR, the switch 216 may be controlled by the control signal ΦS, and the switch 218 may be controlled by the clock signals ΦR and ΦD.

The clock signal ΦR is used to enable/disable a reset phase of the SCLF 106. The clock signal ΦU is used to enable/disable a precharge phase of the SCLF 106. The clock signal ΦC is used to enable/disable a predistortion phase of the SCLF 106. The clock signal ΦD is used to enable/disable a charge pump phase of the SCLF 106. The clock signal ΦS is used to enable/disable a charge sharing phase of the SCLF 106. Hence, with proper settings of the clock signals ΦR, ΦU, ΦC, ΦD, ΦS, the SCLF 106 is controlled to operate under one of reset phase, precharge phase, predistortion phase, charge pump phase, and charge sharing phase. In one exemplary design, the SCLF 106 may be controlled to sequentially enter the reset phase, the precharge phase, the predistortion phase, the charge pump phase and the charge sharing phase during one clock cycle of the reference signal REF. However, this is for illustrative purposes only, and is not meant to be a limitation of the present invention. Alternatively, the SCLF 106 may be controlled to sequentially enter the reset phase, the charge pump phase, the precharge phase, the predistortion phase and the charge sharing phase during one clock cycle of the reference signal REF. The same objective of obtaining one or more of the advantages, including reduced quantization noise (which may lead to better spectral purity of the output signal), minimized charge-sharing switch size and resistance (which may lead to less reference feedthrough and/or less propagation delay and peaking), increased headroom of the charge pump (which may lead to better charge pump linearity and/or better charge pump noise performance), and/or an embedded digital interface (which may offer quantization noise cancellation through predistortion), can be achieved. For clarity and simplicity, the following assumes that the SCLF 106 is controlled to sequentially enter the reset phase, the precharge phase, the predistortion phase, the charge pump phase and the charge sharing phase during one clock cycle of the reference signal REF.

Figure 4:
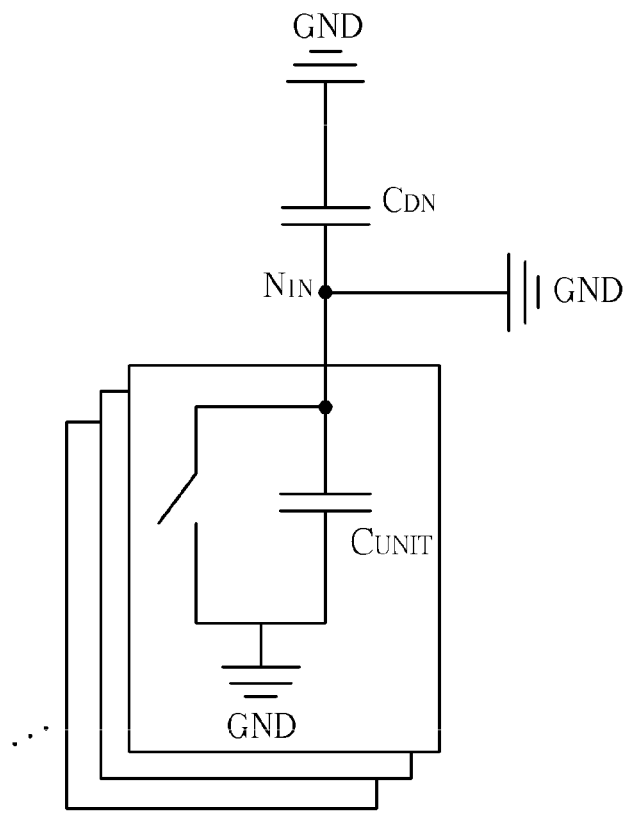
FIG. 4 is a diagram illustrating an equivalent circuit of a switched-capacitor loop filter operating under a reset phase according to an embodiment of the present invention.

FIG. 4 is a diagram illustrating an equivalent circuit of the SCLF 106 operating under the reset phase according to an embodiment of the present invention. When the switches 212 in the first switched-capacitor network 204, the switch 208, and the switch 218 in the second switched-capacitor network 206 are switched on and the switch 202 in the charge pump 104 and the switch 216 in the second switched-capacitor network 206 are switched off, the SCLF 106 enters the reset phase. As can be seen from FIG. 4, two ends of the capacitor $C_{DN}$ are coupled to the same reference voltage (e.g., ground voltage GND), and two ends of each unit capacitor $C_{UNIT}$ are coupled to the same reference voltage (e.g., ground voltage GND). Hence, the capacitor $C_{DN}$ in the second switched-capacitor network 206 and all of the unit capacitors $C_{UNIT}$ in the first switched-capacitor network 204 are reset.

Figure 5:
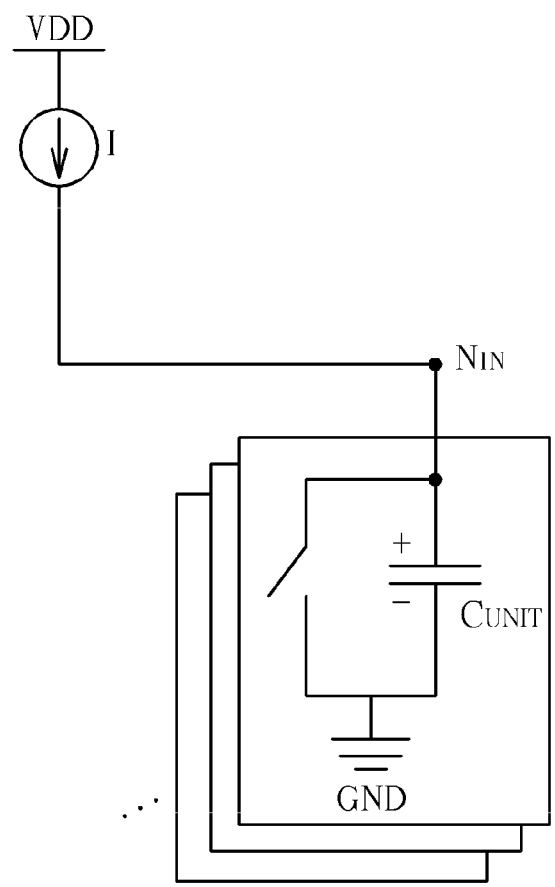
FIG. 5 is a diagram illustrating an equivalent circuit of a switched-capacitor loop filter operating under a precharge phase according to an embodiment of the present invention.

FIG. 5 is a diagram illustrating an equivalent circuit of the SCLF 106 operating under the precharge phase according to an embodiment of the present invention. In one exemplary design, the SCLF 106 may leave the reset phase and enter the precharge phase according to the clock signals generated from the clock generator 114. When the switch 202 in the charge pump 104 and the switches 212 in the first switched-capacitor network 204 are switched on and the switches 216 and 218 in the second switched-capacitor network 206 and the switch 208 are switched off, the SCLF 106 enters the precharge phase. As can be seen from FIG. 5, the current source I is electrically connected to the equivalent capacitor $C_{UP}$ of the first switched-capacitor network 204 for driving the equivalent capacitor $C_{UP}$, where $C_{UP}=256*C_{UNIT}$. In this embodiment, the switch 202 is switched on for a predetermined time period $8*T_{VCO}$, where $T_{VCO}$ is a period of an output clock generated from the VCO 108. Hence, the first switched-capacitor network 204 is precharged to store a fixed charge amount equal to $I*8*T_{VCO}$. In this way, a voltage $$\frac{I*8*T_{VCO}}{C_{UP}}$$

(~200 mV) may be across the equivalent capacitor $C_{UP}$ of the first switched-capacitor network 204 at the end of the precharge phase. That is, the voltage level of the input node $N_{IN}$ of the SCLF 106 may be around 200 mV at the end of the precharge phase. It should be noted that 200 mV is a fixed voltage near the ground voltage GND, and is smaller than one-half of the supply voltage VDD of the charge pump 104. Compared to the conventional charge pump design, the charge pump 104 has large headroom, thus leading to better noise performance and linearity.

Figure 6:
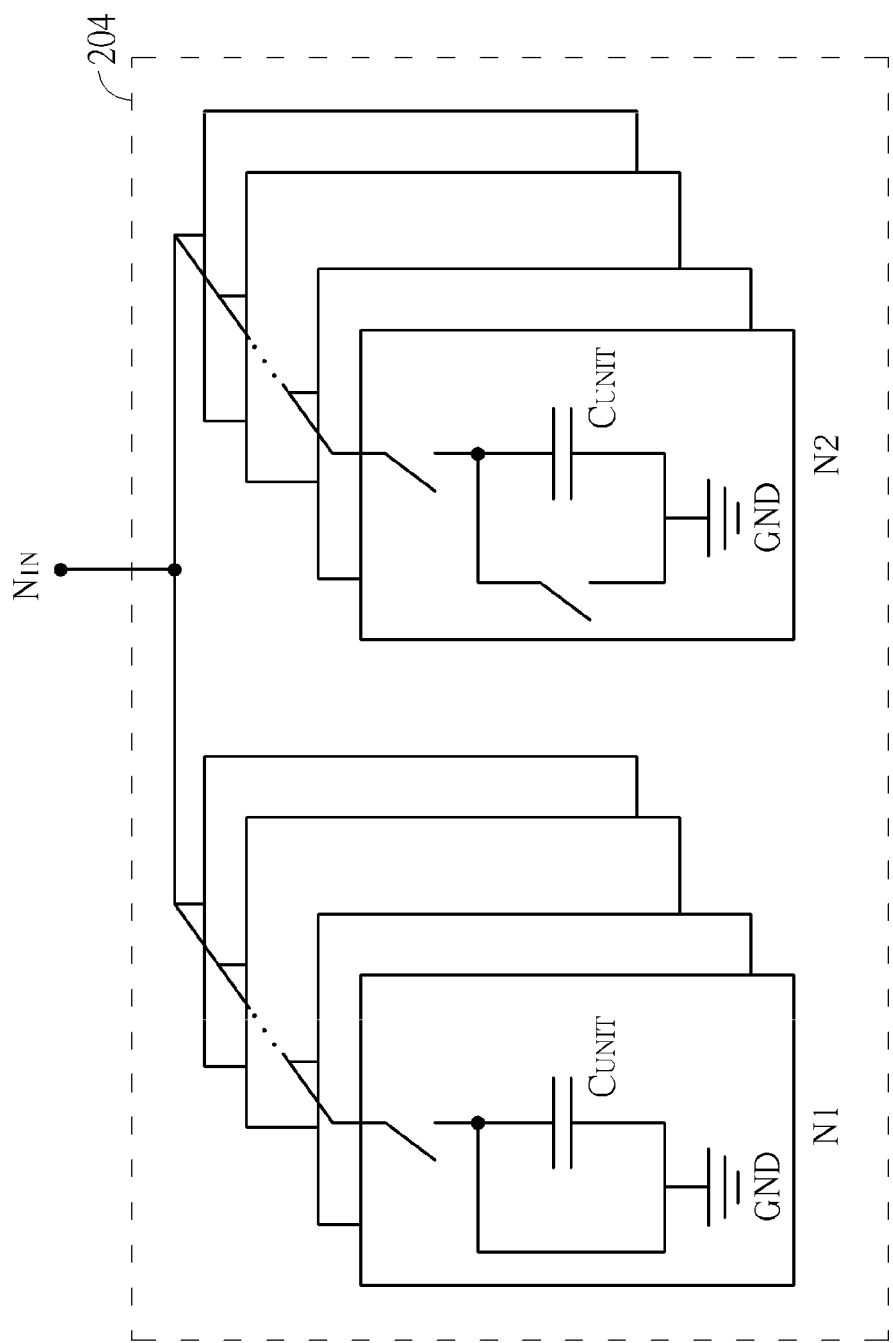
FIG. 6 is a diagram illustrating an equivalent circuit of a switched-capacitor loop filter operating under a predistortion phase according to an embodiment of the present invention.

FIG. 6 is a diagram illustrating an equivalent circuit of the SCLF 106 operating under the predistortion phase according to an embodiment of the present invention. In one exemplary design, the SCLF 106 may leave the precharge phase and enter the predistortion phase according to the clock signals generated from the clock generator 114. When the switch 202 in the charge pump 104, the switches 212 in the first switched-capacitor network 204, the switch 208, and the switches 216 and 218 in the second switched-capacitor network 206 are switched off, the SCLF 106 enters the predistortion phase. Further, the switches 214 in the first switched-capacitor network 204 are controlled according to a set of control signals generated from the phase error calculation circuit 122 implemented in the fractional control module 112. As can be seen from FIG. 6, a portion of the unit capacitors $C_{UNIT}$ (e.g., N1*$C_{UNIT}$) are reset, while a remaining portion of the unit capacitors $C_{UNIT}$ (e.g., N2*$C_{UNIT}$) are kept unchanged, where N1+N2=256. For an integer-N operation, N1 may be set by 128. For a fractional-N operation, N1 may be an integer value ranging from 64 to 192 for a timing error ranging from $-2*T_{VCO}$ to $2*T_{VCO}$. At the beginning of the predistortion phase, the fixed charge amount of $I*8*T_{VCO}$ is kept on the equivalent capacitor $C_{UP}$ of the first switched-capacitor network 204. At the end of the predistortion phase, only the charge amount of $2*I*T_{VCO}$~$6*I*T_{VCO}$ is left on the equivalent capacitor $C_{UP}$ of the first switched-capacitor network 204. Hence, at the end of the predistortion phase, a charge amount associated with the estimated quantization noise is stored in the first switched-capacitor network 204 for following quantization noise cancellation.

Figure 7:
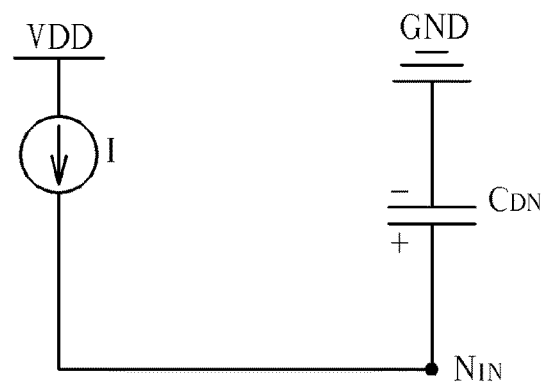
FIG. 7 is a diagram illustrating an equivalent circuit of a switched-capacitor loop filter operating under a charge pump phase according to an embodiment of the present invention.

FIG. 7 is a diagram illustrating an equivalent circuit of the SCLF 106 operating under the charge pump phase according to an embodiment of the present invention. In one exemplary design, the SCLF 106 may leave the predistortion phase and enter the charge pump phase according to the clock signals generated from the clock generator 114. When the switch 202 in the charge pump 104 and the switch 218 in the second switched-capacitor network 206 are switched on and the switches 212 in the first switched-capacitor network 204, the switch 208, and the switch 216 in the second switched-capacitor network 206 are switched off, the SCLF 106 enters the charge pump phase.

When the SCLF 106 enters the charge pump phase, the charge pump 104 operates in response to an output of the PD 102. As shown in FIG. 7, the current source I is electrically connected to the capacitor $C_{DN}$ of the second switched-capacitor network 206 for driving the capacitor $C_{DN}$ on the basis of the PD output, where $C_{DN}=C_{UP}=256*C_{UNIT}$. In addition to the charge amount associated with the desired phase difference, the charge amount associated with the undesired quantization phase error is stored on the capacitor $C_{DN}$. For example, with regard to the undesired quantization phase error, the charge amount of $2*I*T_{VCO}\sim 6*I*T_{VCO}$ is stored on the capacitor $C_{DN}$ of the second switched-capacitor network 206 at the end of the charge pump phase, which is substantially equal to the charge amount left on the equivalent capacitor $C_{UP}$ of the first switched-capacitor network 204 at the end of the predistortion phase. Hence, in addition to a voltage induced due to the desired phase difference, a voltage $$\frac{I*2*T_{VCO}}{C_{DN}} \sim \frac{I*6*T_{VCO}}{C_{DN}}$$

(~100 mV) induced by the undesired quantization phase error may be across the capacitor $C_{DN}$ of the second switched-capacitor network 206. Since the voltage induced due to the desired phase difference is small (~+/−2 mV), the voltage level of the input node $N_{IN}$ of the SCLF 106 may be around 100 mV. It should be noted that 100 mV is a voltage near the ground voltage GND, and is smaller than one-half of the supply voltage VDD of the charge pump 104. Compared to the conventional charge pump design, the charge pump 104 has larger headroom, thus leading to better noise performance and linearity.

Moreover, since the current source I is used for driving the equivalent capacitor $C_{UP}$ of the first switched-capacitor network 204 during the precharge phase and also used for driving the capacitor $C_{DN}$ of the second switched-capacitor network 206 during the charge pump phase, correlated double sampling (CDS) may be applied to the charge pump noise. More specifically, a charge amount associated with the undesired low-frequency charge pump noise may also be stored in the equivalent capacitor $C_{UP}$ of the first switched-capacitor network 204 at the end of the precharge phase, and a charge amount associated with the undesired low-frequency charge pump noise may also be stored in the capacitor $C_{DN}$ of the second switched-capacitor network 204 at the end of the charge pump phase. Ideally, the charge amount associated with the undesired low-frequency charge pump noise that is stored in the equivalent capacitor $C_{UP}$ of the first switched-capacitor network 204 may be substantially equal to the charge amount associated with the undesired low-frequency charge pump noise that is stored in the capacitor $C_{DN}$ of the second switched-capacitor network 204.

Figure 8:
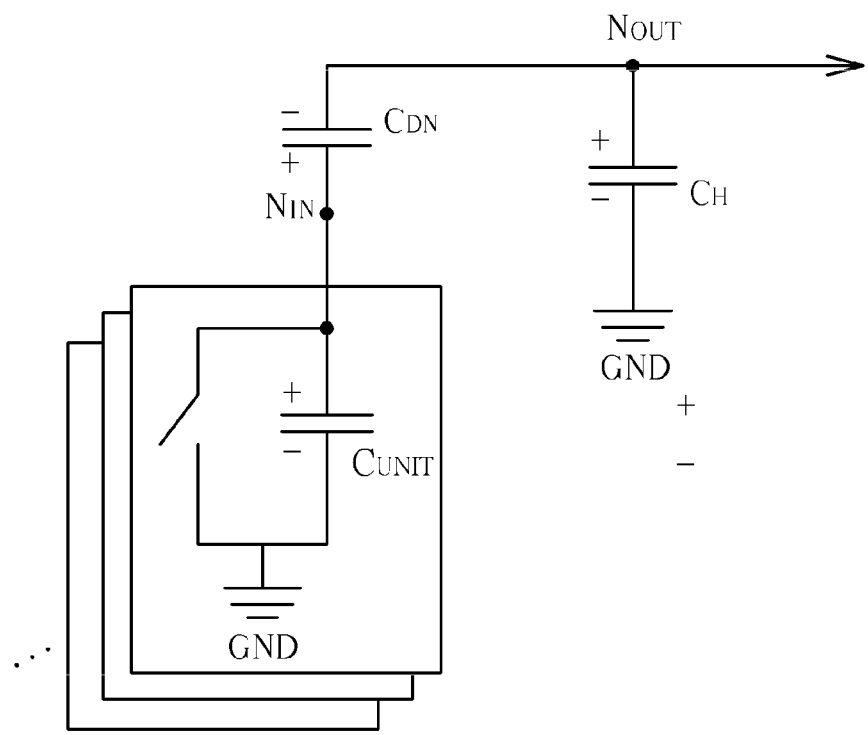
FIG. 8 is a diagram illustrating an equivalent circuit of a switched-capacitor loop filter operating under a charge sharing phase according to an embodiment of the present invention.

FIG. 8 is a diagram illustrating an equivalent circuit of the SCLF 106 operating under the charge sharing phase according to an embodiment of the present invention. In one exemplary design, the SCLF 106 may leave the charge pump phase and enter the charge sharing phase according to the clock signals generated from the clock generator 114. When the switches 212 in the first switched-capacitor network 204 and the switch 216 in the second switched-capacitor network 206 are switched on and the switch 218 in the second switched-capacitor network 206 and the switches 202 and 208 are switched off, the SCLF 106 enters the charge sharing phase. As can be seen from FIG. 8, the unit capacitors $C_{UNIT}$ are coupled to the capacitor $C_{DN}$ during the charge sharing phase, and the capacitor $C_{DN}$ is coupled to the capacitor $C_H$ during the charge sharing phase. By way of example, but not limitation, the timing of switching on the switch 216 may be controlled to be later than the timing of switching on the switches 212 during the charge sharing phase. In this way, charge sharing between the unit capacitors $C_{UNIT}$ and the capacitor $C_{DN}$ may be performed before charge sharing between the capacitor $C_{DN}$ and the capacitor $C_H$ is started. However, this is for illustrative purposes only, and is not meant to be a limitation of the present invention.

The needed noise cancellation can be achieved through the charge sharing effect. At the beginning of the charge sharing phase, the polarity of the capacitor $C_{DN}$ viewed from the input node $N_{IN}$ of the SCLF 106 is the same as the polarity of the equivalent capacitor $C_{UP}$ viewed from the input node $N_{IN}$ of the SCLF 106. Therefore, the charge sharing will make the charge amount stored in the equivalent capacitor $C_{UP}$ subtracted from the charge amount stored in the capacitor $C_{DN}$. As mentioned above, concerning the quantization phase error, the charge amount of $2*I*T_{VCO}\sim 6*I*T_{VCO}$ stored on the capacitor $C_{DN}$ of the second switched-capacitor network 206 at the end of the charge pump phase is substantially equal to the charge amount left on the equivalent capacitor $C_{UP}$ of the first switched-capacitor network 204 at the end of the predistortion phase. Hence, the quantization phase error can be reduced/cancelled at the charge sharing phase. Further, the charge amount associated with the undesired low-frequency charge pump noise that is stored on the equivalent capacitor $C_{UP}$ of the first switched-capacitor network 204 may be substantially equal to the charge amount associated with the undesired low-frequency charge pump noise that is stored on the capacitor $C_{DN}$ of the second switched-capacitor network 204. Hence, the charge pump noise can also be reduced/cancelled at the charge sharing phase.

At the beginning of the charge sharing phase, a control voltage currently supplied to the VCO 108 is stored in the capacitor $C_H$. The quantization phase error and/or the charge pump noise may be reduced/cancelled by charge sharing. The net charge amount (e.g., the charge amount associated with the desired phase difference) is shared between the capacitors $C_{DN}$ and $C_H$ for updating the control voltage supplied to the VCO 108. Since the voltages across the capacitor $C_{DN}$ and the equivalent capacitor $C_{UP}$ may cancel out each other, the voltage across the switch 216 is small. Therefore, even a small N-channel metal-oxide-semiconductor (NMOS) switch with W/L=2u/40n is good enough for the proposed SCLP 106. There is less reference feedthrough (or called reference spur) as well as lower switch resistance (which may be smaller than 200Ω).

As mentioned above, the quantization noise cancellation is performed by applying predistortion to the first switched-capacitor network (e.g., CDAC) 204 and enabling charge sharing between the first switched-capacitor network (e.g., CDAC) 204 and the second switched-capacitor network 206. Hence, an output voltage of the switched-capacitor circuit, including the first switched-capacitor network (e.g., CDAC) 204 and the second switched-capacitor network 206, is adjusted by a set of control signals generated from the phase error calculation circuit 122 for predistortion.

Figure 9:
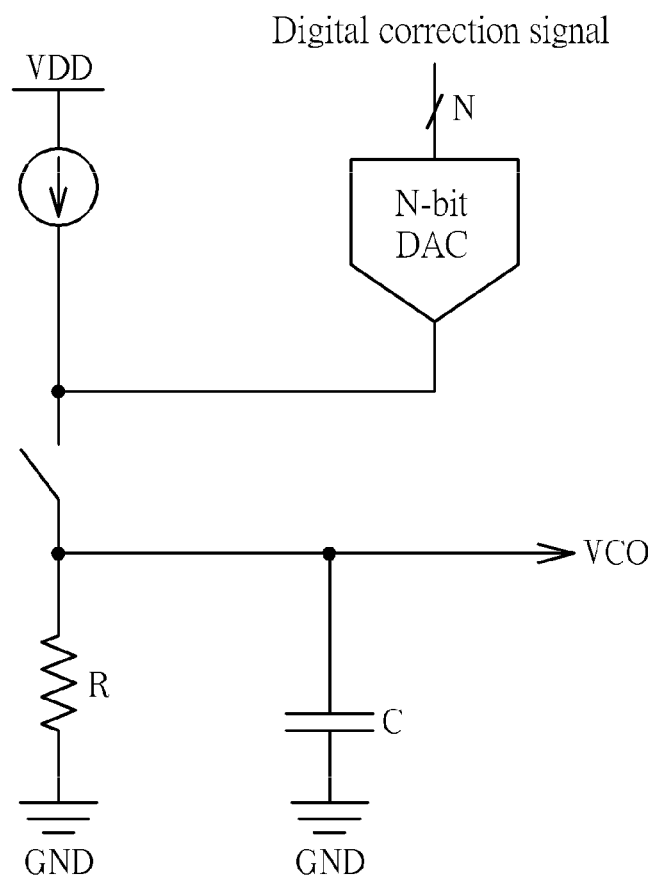
FIG. 9 is a diagram illustrating an equivalent circuit of the combination of the charge pump and the switched-capacitor loop filter shown in FIG. 2.

FIG. 9 is a diagram illustrating an equivalent circuit of the combination of CP 104 and SCLP 106 shown in FIG. 2. As can be seen from FIG. 9, there is no integrator function implemented in the SCLP 106. In general, the type of a PLL is defined as the number of integrators in its open loop transfer function. It should be noted that the VCO contributes one integrator. Hence, a PLL with a loop filter implemented using the proposed switched-capacitor loop filter is a Type-I PLL, where there is no direct-current (DC) pole. Compared to the Type-I PLL, the Type-II PLL has certain advantages. To convert the Type-I PLL into a Type-II PLL, the present invention further proposes adding an integral path to a closed-loop system that uses the proposed switched-capacitor loop filter. Please refer to FIG. 1 again. An integral path may be established between the SCLF 106 and the VCO 108, for example, through the ADC 116 and the integrator circuit 118. The ADC 116 is arranged to convert the loop filter output into a digital signal and output the digital signal to the integrator circuit 118. The integrator circuit 118 contains at least one integrator INT, and is arranged to generate an integrator output according to the loop filter output. The VCO 108 may be a hybrid VCO controlled based on an analog control input generated from the SCLF 106 and a digital control input generated from the integral path. Hence, the VCO 108 is arranged to receive the loop filter output and the integrator output, where a clock output of the VCO is responsive to the loop filter output and the integrator output. It should be noted that using ADC 116 and integrator circuit 118 to realize the integral path is merely one feasible implementation. Alternatively, the integral path may be realized by using analog circuits only.

Figure 10:
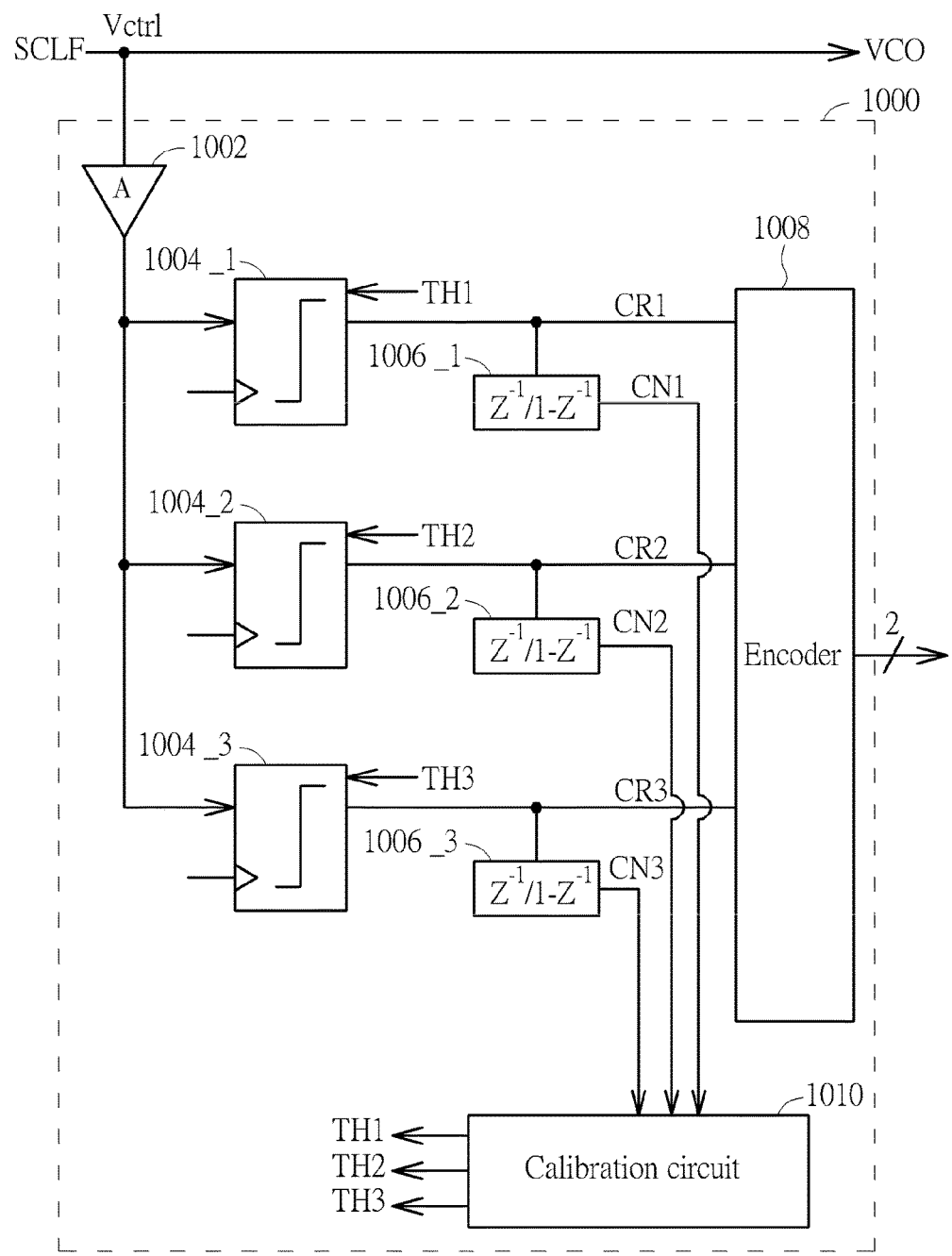
FIG. 10 is a diagram illustrating one analog-to-digital converter design according to an embodiment of the present invention.

FIG. 10 is a diagram illustrating an exemplary ADC design according to an embodiment of the present invention. By way of example, but not limitation, the ADC 116 shown in FIG. 1 may be implemented using a 2-bit Flash ADC 1000 with embedded threshold voltage calibration as shown in FIG. 10. The 2-bit Flash ADC 1000 may include an amplifier 1002, a plurality of comparators 1004_1, 1004_2, 1004_3, a plurality of counters 1006_1, 1006_2, 1006_3, an encoder 1008, and a calibration circuit 1010. The loop filter output of the SCLF 106 serves as one analog control input (i.e., control voltage $V_{ctrl}$) of the VCO 108. The same control voltage $V_{ctrl}$ is fed into each of the comparators 1006_1-1006_3 through the amplifier 1002 with a gain A. The comparator 1006_1 compares the voltage input $A*V_{ctrl}$ with a first threshold voltage TH1 to generate a first comparison result CR1 to the encoder 1008. The comparator 1006_2 compares the voltage input $A*V_{ctrl}$ with a second threshold voltage TH2 to generate a second comparison result CR2 to the encoder 1008, where TH2<TH1. The comparator 1006_3 compares the voltage input $A*V_{ctrl}$ with a third threshold voltage TH3 to generate a third comparison result CR3 to the encoder 1008, where TH3<TH2. The first comparison result CR1, the second comparison result CR2 and the third comparison result CR3 form a 3-bit thermometer code. Hence, the encoder 1008 is arranged to convert the 3-bit thermometer code into a 2-bit binary code, and output the 2-bit binary code to a following circuit component (e.g., integrator circuit 118 shown in FIG. 1).

In this embodiment, an embedded threshold voltage calibration function is supported by the 2-bit Flash ADC 1000 through the counters 1006_1-1006_3 and the calibration circuit 1010. For example, the counter 1006_1 may be arranged to count the number of 1's occurring in a plurality of first comparison results CR1 generated during a predetermined period of time (e.g., 10 ms), and accordingly generate a first count value CN1 to the calibration circuit 1010. The counter 1006_2 may be arranged to count the number of 1's occurring in a plurality of second comparison results CR2 generated during the predetermined period of time (e.g., 10 ms), and accordingly generate a second count value CN2 to the calibration circuit 1010. The counter 1006_3 may be arranged to count the number of 1's occurring in a plurality of third comparison results CR3 generated during the predetermined period of time (e.g., 10 ms), and accordingly generate a third count value CN3 to the calibration circuit 1010. The first count value CN1, the second count value CN2 and the third count value CN3 are indicative of the statistic behavior of the 2-bit Flash ADC 1000. Hence, the calibration circuit 1010 is arranged to monitor the statistic behavior of the 2-bit Flash ADC 1000 according to the first count value CN1, the second count value CN2 and the third count value CN3, and dynamically calibrate the threshold voltage setting (e.g., TH1, TH2 and TH3) of the 2-bit Flash ADC 1000 according to the statistic behavior of the 2-bit Flash ADC 1000.

Figure 11:
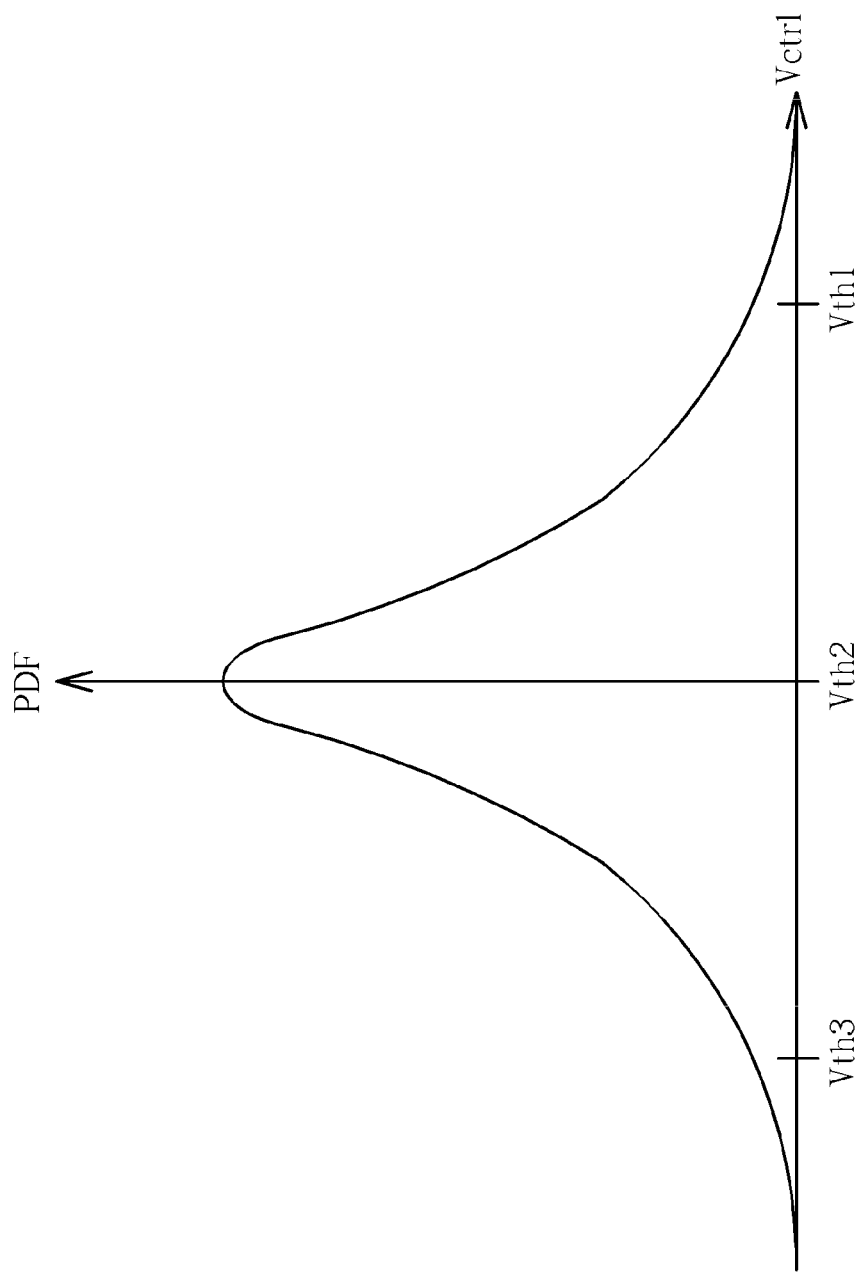
FIG. 11 is a diagram illustrating a power density distribution of a control voltage of a voltage-controlled oscillator according to an embodiment of the present invention.

FIG. 11 is a diagram illustrating a power density distribution of the control voltage $V_{ctrl}$ of the VCO 108 according to an embodiment of the present invention. With regard to the control voltage $V_{ctrl}$ generated from the SCLF 106 to the VCO 108, it has a Gaussian probability density function (PDF). Specifically, the probability density distribution of the control voltage $V_{ctrl}$ has a bell shape. Therefore, the occurrence frequency of the control voltage $V_{ctrl}=V_{th}2$ has the highest value, the occurrence frequency of the control voltage $V_{ctrl}=V_{th}1$ has a lower value, and the occurrence frequency of the control voltage $V_{ctrl}=V_{th}3$ has a lower value. In a case where the threshold voltages TH1, TH2 and TH3 are exactly set by the voltage values $V_{th}1$, $V_{th}2$, $V_{th}3$, respectively, the probability of 1's generated from the comparator 1004_1 should be lowest, the probability of 1's generated from the comparator 1004_2 should be 50%, and the probability of 1's generated from the comparator 1004_3 should be highest. Based on above observation, the calibration circuit 1010 can check the first count value CN1, the second count value CN2 and the third count value CN3 to detect if the threshold voltages TH1, TH2 and TH3 are deviated from the expected voltage values. In this way, the threshold voltages TH1, TH2 and TH3 can be adaptively adjusted on the basis of the statistic behavior of the 2-bit Flash ADC 1000.

In the embodiment shown in FIG. 1, the closed-loop system using the proposed switched-capacitor loop filter is a PLL. However, this is for illustrative purposes only, and is not meant to be a limitation of the present invention. Any closed-loop system using the proposed switched-capacitor loop filter falls within the scope of the present invention. For example, the proposed switched-capacitor loop filter may be employed by a delay-locked loop (DLL) with a controllable component implemented using a voltage-controlled delay line (VCDL).

Those skilled in the art will readily observe that numerous modifications and alterations of the device and method may be made while retaining the teachings of the invention. Accordingly, the above disclosure should be construed as limited only by the metes and bounds of the appended claims.

The invention claimed is:
1. A loop filter comprising:
a first switched-capacitor network, coupled to an input node of the loop filter; and
a second switched-capacitor network, coupled to the input node of the loop filter;

wherein the input node of the loop filter is arranged to receive an input from a charge pump;

wherein the first switched-capacitor network and the second switched-capacitor network are arranged to control a voltage level at the input node of the loop filter to be lower than one-half of a supply voltage of the charge pump; the first switched-capacitor network is precharged by the charge pump to store a predetermined charge amount under a precharge phase of the loop filter, where the voltage level at the input node of the loop filter is lower than one-half of the supply voltage of the charge pump at an end of the precharge phase; and the second switched-capacitor network is charged by the same charge pump in response to a phase detector output under a charge pump phase of the loop filter, where the voltage level at the input node of the loop filter is lower than one-half of the supply voltage of the charge pump at an end of the charge pump phase.

2. The loop filter of claim 1, wherein the loop filter is part of a closed-loop system, and the first switched-capacitor network and the second switched-capacitor network are arranged to reduce quantization noise of the closed-loop system.

3. The loop filter of claim 1, wherein the first switched-capacitor network and the second switched-capacitor network are arranged to reduce noise of the charge pump.

4. The loop filter of claim 1, wherein the first switched-capacitor network is coupled between the input node of the loop filter and a reference voltage; the second switched-capacitor network is coupled between the input node of the loop filter and the reference voltage, and is further arranged to generate an output to an output node of the loop filter.

5. The loop filter of claim 4, further comprising:
a first switch, coupled between the input node of the loop filter and the reference voltage;
wherein the first switched-capacitor network comprises:
a capacitor digital-to-analog converter (CDAC), comprising:
a plurality of second switches, wherein each of the second switches has a first end and a second end; and
a plurality of unit capacitors, coupled to the second switches, respectively, wherein each of the unit capacitors has a first end and a second end; said second end of said each of the unit capacitors is coupled to the reference voltage; said first end of one of the unit capacitors is coupled to said second end of one of the second switches; and said second end of said each of the second switches is coupled to the input node of the loop filter.

6. The loop filter of claim 5, wherein when the input node of the loop filter is disconnected from the charge pump, the first switch and the second switches are switched on to reset the unit capacitors.

7. The loop filter of claim 5, wherein when the input node of the loop filter is connected to the charge pump, the first switch is switched off and the second switches are switched on to allow the charge pump to drive the unit capacitors.

8. The loop filter of claim 5, wherein the loop filter is part of a closed-loop system; and when the input node of the loop filter is disconnected from the charge pump, the first switch and the second switches are switched off, and the CDAC is controlled to apply predistortion according to an estimated quantization phase error of the closed-loop system.

9. The loop filter of claim 5, wherein when the input node of the loop filter is connected to the charge pump, the first switch and the second switches are switched off to allow the charge pump to drive the second switched-capacitor network.

10. The loop filter of claim 5, wherein when the input node of the loop filter is disconnected from the charge pump, the first switch is switched off and the second switches are switched on to enable charge sharing between the unit capacitors and the second switched-capacitor network.

11. The loop filter of claim 4, wherein the second switched-capacitor network comprises:
a first switch, having a first end and a second end, wherein the first end of the first switch is coupled to the reference voltage;
a first capacitor, having a first end and a second end, wherein the first end of the first capacitor is coupled to the second end of the first switch, and the second end of the first capacitor is coupled to the input node of the loop filter; and
a second switch, having a first end and a second end, wherein the first end of the second switch is coupled to the first end of the first capacitor, and the second end of the second switch is coupled to an output node of the loop filter; and
the loop filter further comprises:
a third switch, coupled between the input node of the loop filter and the reference voltage; and
a second capacitor, coupled between the output node of the loop filter and the reference voltage.

12. The loop filter of claim 11, wherein when the input node of the loop filter is disconnected from the charge pump, the first switch and the third switch are switched on and the second switch is switched off to reset the first capacitor.

13. The loop filter of claim 11, wherein when the input node of the loop filter is connected to the charge pump, the first switch, the second switch and the third switch are switched off to allow the charge pump to drive the first switched-capacitor network.

14. The loop filter of claim 11, wherein the loop filter is part of a closed-loop system; and when the input node of the loop filter is disconnected from the charge pump, the first switch, the second switch and the third switch are switched off to allow the first switched-capacitor network to apply predistortion according to an estimated quantization phase error of the closed-loop system.

15. The loop filter of claim 11, wherein when the input node of the loop filter is connected to the charge pump, the first switch is switch on and the second switch and the third switch are switched off to allow the charge pump to drive the first capacitor.

16. The loop filter of claim 11, wherein when the input node of the loop filter is disconnected from the charge pump, the first switch and the third switch are switched off and the second switch is switched on to enable charge sharing between the first capacitor and the second capacitor.

17. A signal processing circuit comprising:
a loop filter, arranged to generate a loop filter output in response to a loop filter input generated from a charge pump;
an integrator circuit, arranged to receive an input signal representative of the loop filter output that is generated from the loop filter and is directly fed into a controllable component, and generate an integrator output according to the input signal;
the controllable component, arranged to receive the loop filter output and the integrator output, wherein an output of the controllable component is responsive to the loop filter output and the integrator output;

an analog-to-digital converter (ADC), arranged to convert the loop filter output into a digital signal and output the digital signal to the integrator circuit to act as the input signal of the integrator circuit; and a calibration circuit, arranged to monitor a statistical behavior of the ADC to calibrate a threshold voltage setting of the ADC.

* * * * *